United States Patent
Ogata et al.

(10) Patent No.: US 6,394,670 B2
(45) Date of Patent: May 28, 2002

(54) PARTS MAINTENANCE MANAGING SYSTEM

(75) Inventors: Kunie Ogata, Tokyo-To; Takashi Aiuchi, Fuchu; Masanori Tateyama, Kumamoto-Ken, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/853,748

(22) Filed: May 14, 2001

(30) Foreign Application Priority Data

May 15, 2000 (JP) ........................................ 2000-142518

(51) Int. Cl.$^7$ ................................................. G03D 5/00
(52) U.S. Cl. ........................... 396/611; 399/24; 210/87; 200/81.9 M
(58) Field of Search ........................ 396/611, 564–636; 118/52, 54, 56, 319–321, 666–668; 427/240; 355/27–29, 38, 40, 41, 77; 399/24; 210/87; 347/19; 200/81.9 M

(56) References Cited

U.S. PATENT DOCUMENTS 5,550,956 A * 8/1996 Tadokoro ..................... 347/19
5,850,583 A * 12/1998 Song et al. ................... 399/24
5,888,381 A * 3/1999 Primdahl et al. ...... 200/81.9 M

* cited by examiner

Primary Examiner—D Rutledge
(74) Attorney, Agent, or Firm—Oblon, Spivak, McClelland, Maier & Neustadt, P.C.

(57) ABSTRACT

A system comprises a first maintenance interval storage for storing a first maintenance interval of each component which is not related to an actual utilization of an apparatus, a second maintenance interval storage storing a second maintenance interval of each component which is related to the actual utilization of the apparatus, a maintenance demander for demanding maintenance of some component based on the passing of the first maintenance interval of this component; and a maintenance interval prolonger for judging the second maintenance interval has passed or not based on the passing of the first maintenance interval, and when the second maintenance interval has not yet passed, suspending the demand for maintenance by the maintenance demander and prolonging the first maintenance interval. Consequently, it becomes possible to manage a maintenance timing of each component and give notice thereof on the side of the apparatus composed of a plurality of components.

11 Claims, 8 Drawing Sheets

FIRST MAINTENANCE INTERVAL

| ID | COMPONENT NAME | FIRST MAINTENANCE INTERVAL | PROLONGATION |
|---|---|---|---|
| 1 | RESIST FILTER | 6 MONTHS | 10% |
| 2 | AIR FILTER | 12 MONTHS | 0% (NOT PROLONGED) |
| 3 | MOTOR GREASE UP | 6 MONTHS | 10% |
| 4 | DRIVING CYLINDER | 6 MONTHS | 10% |
| ⋮ | ⋮ | ⋮ | ⋮ |

FIG. 6

SECOND MAINTENANCE INTERVAL

| ID | COMPONENT NAME | SECOND MAINTENANCE INTERVAL |
|---|---|---|
| 1 | RESIST FILTER | UNIT OPERATING TIME |
| 2 | AIR FILTER | 12 MONTHS |
| 3 | MOTOR GREASE UP | ROTATION DISTANCE |
| 4 | DRIVING CYLINDER | NUMBER OF TIMES OF OPERATION |
| ⋮ | ⋮ | ⋮ |

FIG. 7

PARTS MAINTENANCE MANAGING SYSTEM

BACKGROUND OF THE INVENTION

1. Field of the Invention

The present invention relates to a parts maintenance management system, for example, which is provided in a semiconductor device fabrication apparatus having many expendable components, for managing maintenance timings of respective components.

2. Description of the Related Arts

In the process of fabricating a semiconductor device, for example, there is a successive process called photolithography in which a resist film is formed on a semiconductor wafer (hereinafter referred to as a wafer), exposed after a circuit pattern or the like is reduced by means of phototechnology, and developed. As an automatic apparatus for performing this photolithography process, for example, a coating and developing processing apparatus for performing coating of a resist and developing is used.

This coating and developing apparatus uses many expendable components such as a rotational driving motor for rotationally driving the wafer and a filter for removing impurities from a resist solution. For these expendable components, replacement timings recommended by their manufactures are set, and based on the arrival of each expendable component at the replacement timing, a user contacts the manufacturer of the expendable component and replaces this component.

The conventional management of expendable components is, however, left to a user of an apparatus, and hence the expendable components need to be managed in the user's own management way. Moreover, in the replacement of expendable components based on simple exchange timings, the expendable components are sometimes replaced even when these expendable components are still sufficiently usable, which is undesirable from both environmental and economical viewpoints. Meanwhile, user's selfish judgement is dangerous since it leads to the breakdown of the entire apparatus.

SUMMARY OF THE INVENTION

An object of the present invention is to provide a parts maintenance management system capable of managing a maintenance timing of each component and giving notice thereof on the side of an apparatus composed of a plurality of components.

To attain the aforesaid object, according to a first aspect of the present invention, there is provided a system for managing a maintenance timing of a component, comprising: a first maintenance interval storage for storing a first maintenance interval of the component which is not related to an actual utilization of a predetermined apparatus; a second maintenance interval storage storing a second maintenance interval of the component which is related to the actual utilization of the predetermined apparatus; a maintenance demander for demanding maintenance of the component based on passing of the first maintenance interval; and a maintenance interval prolonger for judging whether the second maintenance interval has passed or not based on the passing of the first maintenance interval, and when the second maintenance interval has not yet passed, suspending the demand for maintenance by the maintenance demander and prolonging the first maintenance interval.

According to such a configuration, the maintenance interval of the component can be managed on the apparatus side, in which case the first maintenance interval can be properly prolonged with reference to the first maintenance interval which is set irrespective of the actual operation of the apparatus and the second maintenance interval which is set based on the actual operation of the apparatus.

In this parts maintenance management system, it is preferable that the actual utilization of the apparatus which is related to the second maintenance interval be an actual operating time, a movement distance, the number of times of operation, and the like of the apparatus depending to components. Moreover, it is desirable that this parts maintenance management system further comprises: a maintenance frequency storage for storing an actual maintenance frequency of the component; and a first maintenance interval updater for taking out the maintenance frequency stored in the maintenance frequency storage after a lapse of a predetermined period and updating the first maintenance interval in the first maintenance interval storage with a shortest maintenance interval in the frequency as the first maintenance interval.

According to a second aspect of the present invention, a system for managing maintenance timings of a first component and a second component in a processing system having a first apparatus having the first component and a second apparatus which has the second component identical to the first component and differs from the first apparatus, comprises: a first maintenance interval storage for storing a first maintenance interval of the first component which is not related to an actual utilization of the first apparatus; a second maintenance interval storage storing a second maintenance interval of the first component which is related to the actual utilization of the first apparatus; a maintenance demander for demanding maintenance of the first and second components based on passing of the first maintenance interval; and a maintenance interval prolonger for judging whether the second maintenance interval has passed or not based on the passing of the first maintenance interval, and when the second maintenance interval has not yet passed, suspending the demand for maintenance by the maintenance demander and prolonging the first maintenance interval.

According to a third aspect of the present invention, a management system for managing maintenance timings of a first component and a second component in a first processing system having the first component and a second processing system which has the second component identical to the first component and is identical to the first processing system comprises a maintenance management center, the first processing system comprising: a first maintenance interval storage for storing a first maintenance interval of the first component which is not related to an actual utilization of the first processing system; a second maintenance interval storage storing a second maintenance interval of the first component which is related to the actual utilization of the first processing system; a first maintenance demander for demanding maintenance of the first component based on passing of the first maintenance interval; a first maintenance interval prolonger for judging whether the second maintenance interval has passed or not based on the passing of the first maintenance interval, and when the second maintenance interval has not yet passed, suspending the demand for maintenance by the first maintenance demander and prolonging the first maintenance interval; and a first transmitter for transmitting at least information on the second maintenance interval stored in the second maintenance interval storage to the maintenance management center, the maintenance management center comprising: a first receiver for receiving the information transmitted from the first transmitter; and a second transmitter for transmitting the information received by the first receiver to the second processing system, and the second processing system comprising a second receiver for receiving the information transmitted from the second transmitter.

These objects and still other objects and advantages of the present invention will become apparent upon reading the following specification when taken in conjunction with the accompanying drawings.

BRIEF DESCRIPTION OF THE DRAWINGS

FIG. 6 is a diagram showing a first maintenance interval;

FIG. 7 is a diagram showing a second maintenance interval;

DETAILED DESCRIPTION OF THE PREFERRED EMBODIMENT

A parts maintenance management system according to an embodiment of the present invention will be explained below with a case where it is applied to a coating and developing processing system for performing coating and developing of a resist film as an example thereof.

Figure 1:
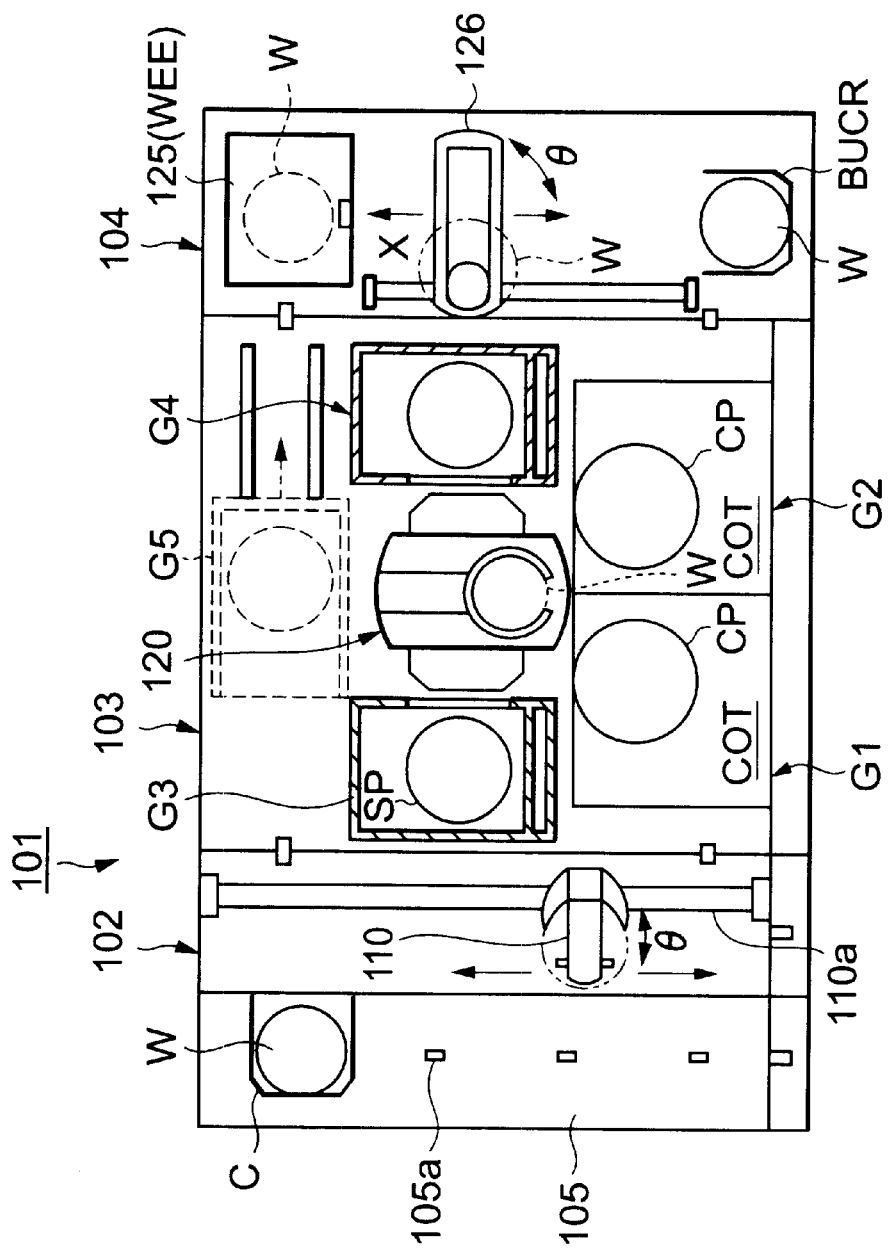
FIG. 1 is a plan view of a coating and developing processing system including a resist coating unit according to an embodiment of the present invention.
Figure 2:
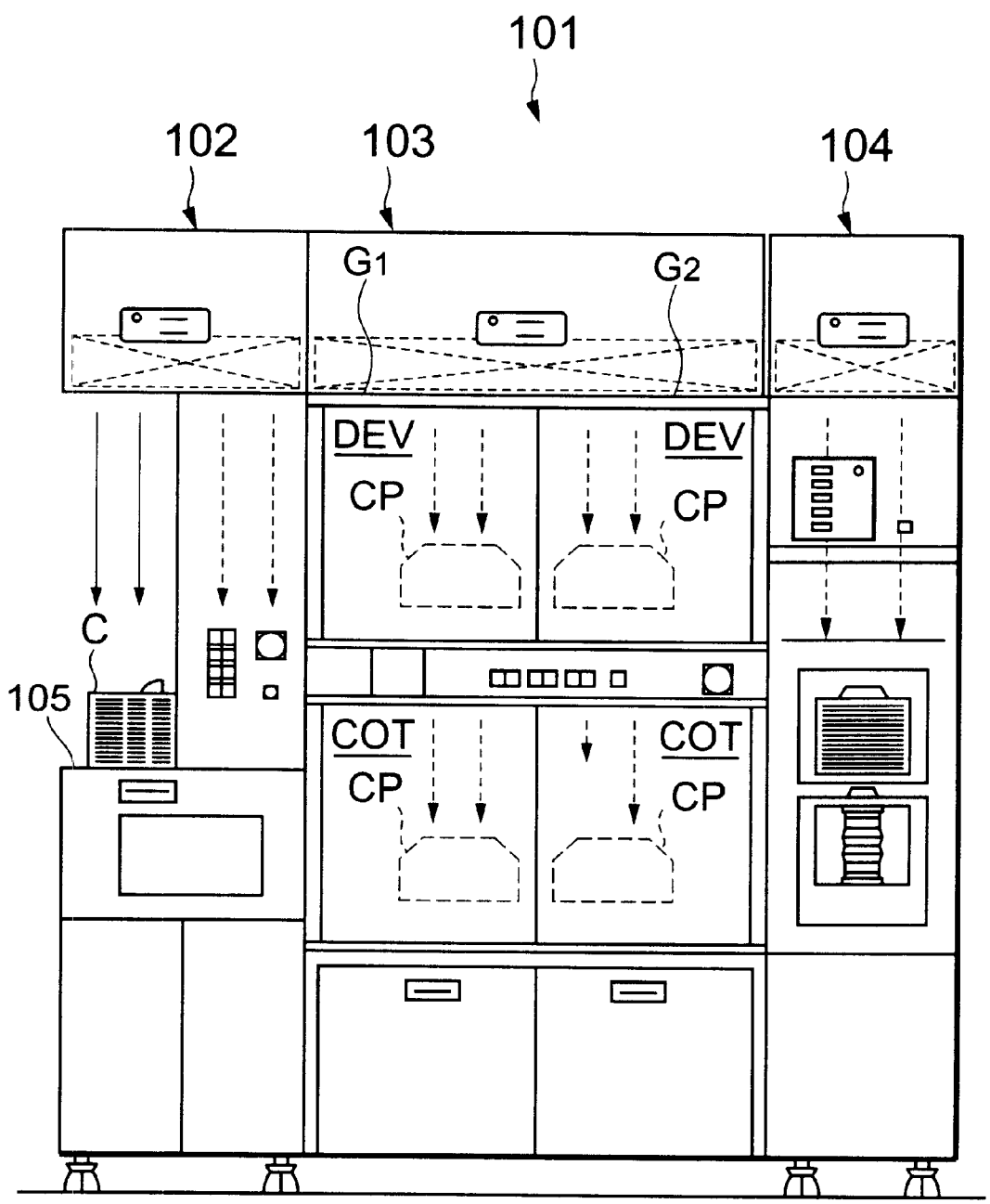
FIG. 2 is a front view of the coating and developing processing system in FIG. 1.
Figure 3:
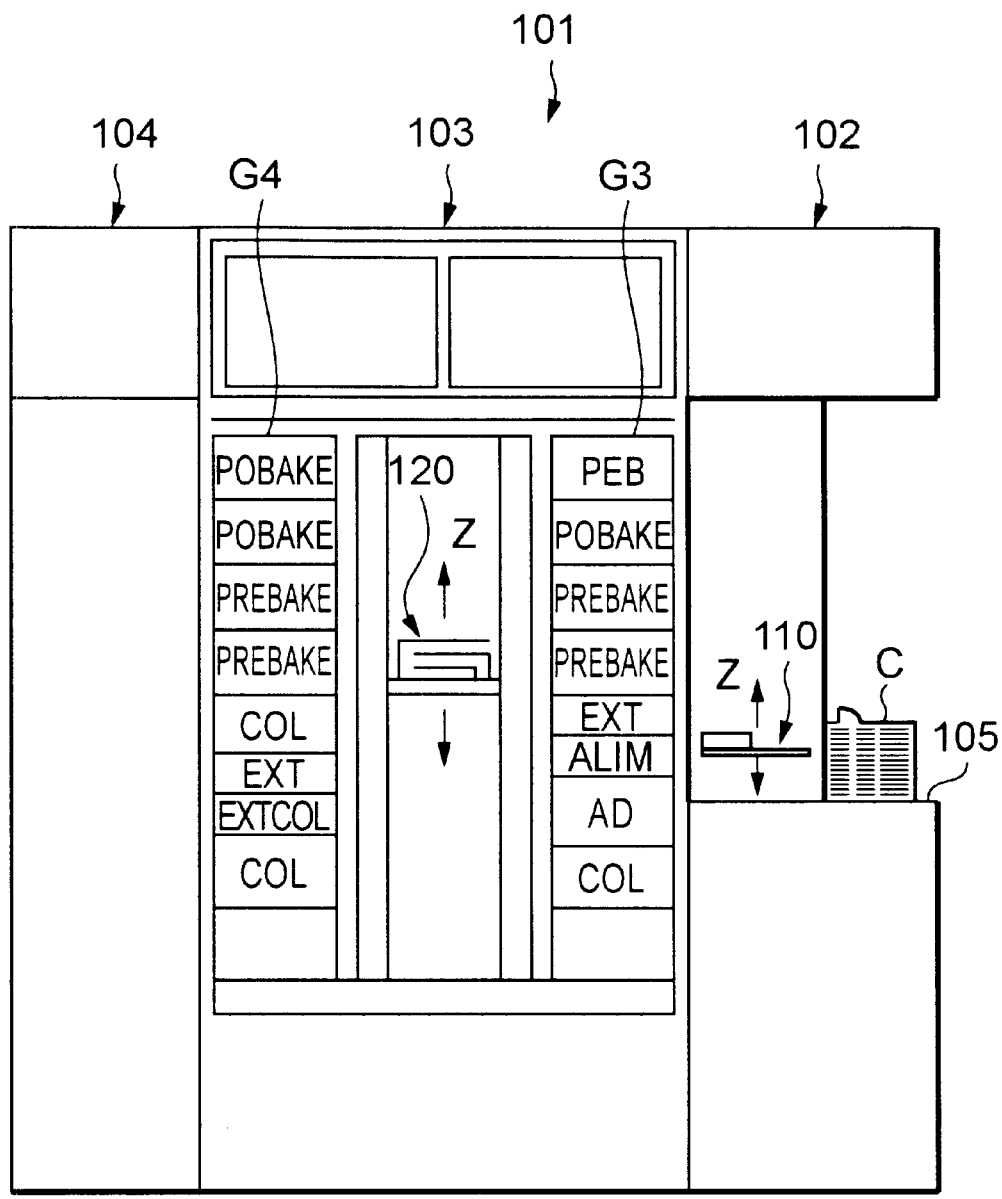
FIG. 3 is a rear view of the coating and developing processing system in FIG. 1.

FIG. 1 to FIG. 3 are diagrams showing the entire structure of this coating and developing processing system.

As shown in FIG. 1, this coating and developing processing system 101 has a structure in which a cassette station 102 for transferring, for example, 25 wafers W per cassette C, as a unit, from/to the outside into/from the coating and developing processing system 101 or carrying the wafer W into/out of the cassette C, a processing station 103 in which various kinds of processing units which perform predetermined processing for the wafers W one by one in a coating and developing process are stacked in multiple tiers, and an interface section 104 for receiving and sending the wafer W from/to an aligner (not illustrated) provided adjacent to the processing station 103 are integrally connected.

In the cassette station 102, a plurality of, for example, four cassettes C are mounted in a line in an X-direction (in a top-to-bottom direction in FIG. 1) at the positions of positioning projections 105a on a cassette mounting table 105 with respective wafer transfer ports facing the processing station 103 side. A wafer carrier 110 movable in the direction of arrangement of the cassettes C (the X-direction) and in the direction of arrangement of the wafers W housed in the cassette C (a Z-direction, i.e., a vertical direction) can freely move along a transfer path 110a to selectively get access to each of the cassettes C.

The wafer carrier 110 is also structured to be rotatable in a θ-direction so as to be able to get access to an alignment unit (ALIM) and an extension unit (EXT) included in units staked in multiple tiers of a third processing unit group G3 on the processing station 103 side as will be described later.

In the processing station 103, a main transfer device 120 is disposed in the middle thereof, and around the main transfer device 120, various processing units are stacked in multiple tiers to compose one or a plurality of processing unit groups. In this coating and developing processing system 101, five processing unit groups G1, G2, G3, G4, and G5 can be disposed. The first and second processing unit groups G1 and G2 are disposed on the front side of the coating and developing processing system 101. The third processing unit group G3 is disposed adjacent to the cassette station 102. The fourth processing unit group G4 is disposed adjacent to the interface section 104. The fifth processing unit group G5 shown by a broken line is disposed on the rear side.

As shown in FIG. 2, in the first processing unit group G1, two spinner-type processing units each of which performs predetermined processing while the wafer W is mounted on a spin chuck within a cup CP, for example, a resist coating unit (COT) shown in FIG. 1 and a developing unit (DEV) are stacked in two tiers from the bottom in order. Also in the second processing unit group G2, similarly to the first processing unit group G1, two spinner-type processing units, for example, a resist coating unit (COT) and a developing unit (DEV) are stacked in two tiers from the bottom in order.

As shown in FIG. 3, in the third processing unit group G3, for example, a cooling unit (COL) for performing cooling processing, an adhesion unit (AD) for enhancing adhesion of a resist and the wafer W, an alignment unit (ALIM) for aligning the wafer W, an extension unit (EXT) for making the wafer W wait, pre-baking units (PREBAKE), a post-baking unit (POBAKE), and a post-exposure baking unit (POBAKE) each for performing baking processing or the like are stacked in eight tiers from the bottom in order. Also in the fourth processing unit group G4, a cooling unit (COL), an extension and cooling unit (EXTCOL), an extension unit (EXT), a cooling unit (COL), pre-baking units (PREBAKE), post-baking units (POBAKE), or the like are stacked in eight tiers from the bottom in order.

As shown in FIG. 1, in the interface section 104, a wafer edge exposure unit 125 (WEE) is disposed at the rear thereof, and a wafer carrier 126 is provided at the center thereof. This wafer carrier 126 is structured to be movable in the X-direction and the Z-direction (the vertical direction) and rotatable in the θ-direction so as to be able to get access to the extension unit (EXT) included in the fourth processing unit group G4 on the processing station 103 side and a wafer delivery table (not illustrated) on the aligner (not illustrated) side.

Next, processing steps in the coating and developing processing system 101 structured as above will be explained.

In the coating and developing processing system 101, after the unprocessed wafer W housed in the cassette C is taken out by the wafer carrier 110 in the cassette station 102, the wafer W is carried into the alignment unit (ALIM) of the third processing unit group G3 in the processing station 103 and aligned. The main transfer device 120 is brought in from the opposite side to carry the wafer W out of the alignment unit (ALIM) and transfer the wafer W. The wafer W is subjected to hydrophobic processing in the adhesion unit (AD) of the third processing unit group G3 and then cooled in the cooling unit (COL) of the third processing unit group G3 or the fourth processing unit group G4. Thereafter, a photoresist film, that is, a photosensitive film is formed by coating in the resist coating unit (COT) of the first processing unit group G1 or the second processing unit group G2.

After the photosensitive film is formed, baking processing is performed in the pre-baking unit (PREBAKE) in the third processing unit group G3 or the fourth processing unit group G4 to vaporize and remove a remaining solvent from the photosensitive film on the wafer W. After cooled in the extension and cooling unit (EXTCOL) of the fourth processing unit group G4, the wafer W is mounted in the extension unit (EXT) of the fourth processing unit group G4. The wafer carrier 126 is brought in from the opposite side to carry the wafer W out.

The wafers W carried out are sequentially subjected to wafer edge exposure processing for exposing the peripheral edge portion of the wafer W, for example, at a width of 2 mm in the wafer edge exposure unit (WEE). The wafers W the periphery of which are exposed are sequentially housed in a buffer cassette (BUCR) by the wafer carrier 126. The wafers W housed in the buffer cassette (BUCR) are delivered one by one to the aligner not illustrated by the wafer carrier 126 every time a receiving signal is given by the alginer.

When exposure by the aligner is completed, the wafer W which has undergone the exposure processing is delivered to the main transfer device 120 via the fourth processing unit group G4 through a route opposite to the one described above, and delivered to the post-exposure baking unit (PEB) by this main transfer device 120. Thus, the wafer W is subjected to baking processing and then cooling processing to a predetermined temperature in the cooling unit (COL).

Subsequently, the wafer W is delivered to the main transfer device 120 and transferred into the developing unit (DEV) of the first processing unit group G1 or the second processing unit group G2 where the wafer W is developed with a developing solution and then the developing solution is rinsed away with a rinse solution. Thus, developing processing is completed.

Thereafter, the wafer W is carried out of the developing unit (DEV) by the main transfer device 120. After subjected to baking processing in the post-baking unit (POBAKE) in the third processing unit group G3 or the fourth processing unit group G4 and cooled in the cooling unit (COL) in the third processing unit group G3 or the fourth processing unit G4, the wafer W is mounted in the extension unit (EXT) in the third processing unit group G3. The wafer carrier 110 is brought in from the opposite side to carry the wafer W out, and the wafer W is carried into the cassette C for housing processed wafers placed in the cassette station 102.

A parts maintenance management system according to this embodiment is connected to a central control unit in this coating and developing processing system. The configuration and operation of this parts maintenance management system will be explained below with a case where the maintenance of components of the aforesaid resist coating unit (COT) for forming the resist film in the coating and developing processing system is performed as an example thereof.

Figure 4:
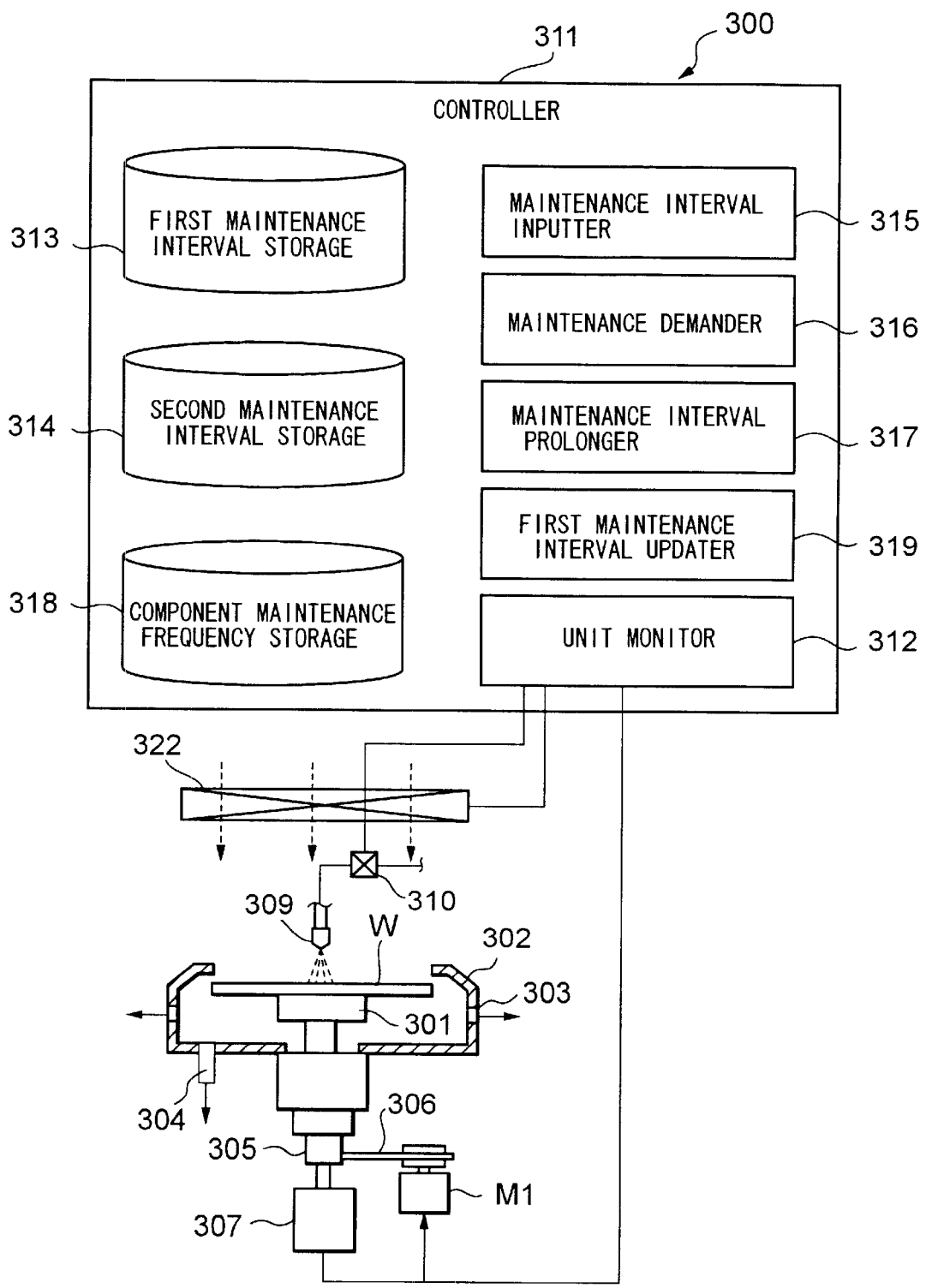
FIG. 4 is a schematic block diagram showing an embodiment of a resist coating unit and a control system according to the present invention.

FIG. 4 is a schematic block diagram showing this resist coating unit (COT) and a control system of a parts maintenance management system 300.

First, portions of the resist coating unit (COT) will be explained.

In FIG. 4, the numeral 301 denotes a spin chuck which is a substrate holder and structured to horizontally hold the wafer W by vacuum suction. A fixed cup 302 is provided to surround the spin chuck 301. An exhaust port 303 and a drain port 304 are formed respectively in a side face and a bottom face of the fixed cup 302. An opening in an upper face of the fixed cup 302 is opened on the occasion of coating of a resist solution.

The spin chuck 301 is provided on the top of a driving shaft 305 in which a rotating shaft and a raising and lowering shaft are coaxially combined, and this driving shaft 305 is structured to be rotatable by a motor M1 via a transmission mechanism 306 including a pulley and a belt and ascendable and descendable by a raising and lowering mechanism 307 (driving cylinder).

A resist solution nozzle 309 for dropping and supplying the resist solution to the center of the wafer W held on the spin chuck 301 is provided above the fixed cup 302. This nozzle 309 is structured to be movable between a position above the center of the wafer W and the outside of the fixed cup 302. The resist solution nozzle 309 is connected to a resist solution tank not illustrated via a filter 310 and a resist solution supply pipe not illustrated and discharges a predetermined quantity of resist solution, for example, by increasing the pressure in the resist solution tank.

Next, a detection and control system will be explained. If only a configuration related to the gist of the present invention will be described, a controller 311 (rotation speed setter) shown in FIG. 4 includes a unit monitor 312 for monitoring the operation of the unit, a first maintenance interval storage 313 for storing first maintenance interval information on respective components which is not related to the actual operation of the unit, a second maintenance interval information storage 314 for storing second maintenance interval information on the respective components which is related to the actual operation of the unit, a maintenance interval inputter 315 for inputting the first and the second maintenance interval information, a maintenance demander 316 for demanding the maintenance of some component based on the passing of the first maintenance interval of this component, a maintenance interval prolonger 317 for judging whether the second maintenance interval has passed or not based on the passing of the first maintenance interval, and when the second maintenance interval has not yet passed, suspending the demand for maintenance by the maintenance demander 316 and prolonging the first maintenance interval, a component maintenance frequency storage 318 for storing a past record of component maintenance as maintenance frequency information, and a first maintenance interval updater 319 for updating the first maintenance interval according to this maintenance frequency.

The aforesaid configuration will be explained below in detail based on each function.

The unit monitor 312 has a function of receiving operating situations of an air filter denoted by the numeral 322 in FIG. 4, the resist filter 310, the driving cylinder 307, and the drive motor M1 in addition to the operation of the entire resist coating unit.

The first maintenance interval storage 313 stores maintenance interval information 324 which is set for expendable components of the unit irrespective of the actual operation of the unit as shown in FIG. 6. In this example, it stores maintenance intervals concerning the maintenance timing of the resist filter 310, the maintenance timing of the air filter 322, the grease-up timing of the motor M1, and the maintenance and inspection timing of the driving cylinder 307. Moreover, this first maintenance interval storage 313 has a prolongation field 325 for storing information whether the first maintenance interval can be prolonged or not based on the second maintenance interval. This prolongation field 325 stores what percentage the interval can be prolonged by when the prolongation is possible.

The second maintenance interval storage 314 stores maintenance interval information 327 on respective expendable components according to the actual operating situation of the unit as shown in FIG. 7. For example, the second maintenance interval of the resist filter is set at a unit operating time, that of the air filter is set at 12 months, that of the motor grease up is set at a motor rotation distance (rotation time×rotation speed), and that of the driving cylinder is set at the number of times of operation.

These first and second maintenance intervals are inputted and set by means of the maintenance interval inputter 315.

Figure 5:
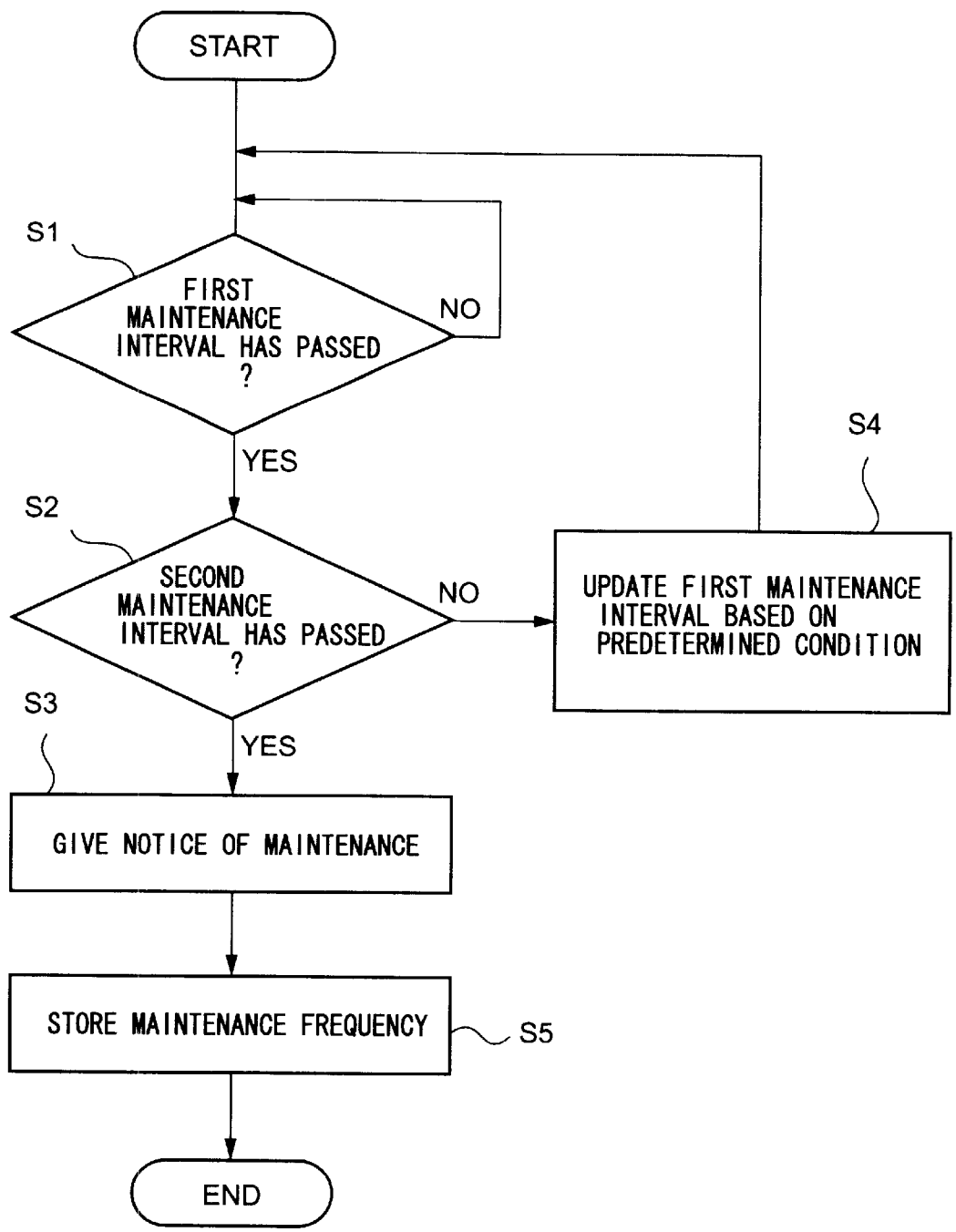
FIG. 5 is a flowchart showing processing steps in a maintenance demander.

Next, processing steps by the maintenance demander 316 will be explained with reference to FIG. 5.

First, the maintenance demander 316 judges whether the first maintenance interval of each component which is not related to the actual operation of the unit has passed based on the information stored in the first maintenance interval storage 313 (step S1). If the example of the driving cylinder 307 is taken up, it judges whether six months have passed since the preceding maintenance. When the first maintenance interval has not yet passed, this step (step S1) is repeated.

Meanwhile, when the first maintenance interval has passed, the maintenance demander 316 judges whether the second maintenance interval has passed or not (step S2). This judgement is performed by receiving the actual operating situation of the unit from the unit monitor 312 and applying it to the second maintenance interval. In case of the example of the driving cylinder 307, for example, the maintenance demander 316 judges whether the number of times of operation of the driving cylinder 307 reaches a predetermined number of times. When judging that the second maintenance interval also has passed, it gives an operator notice of maintenance. Meanwhile, when judging that the second maintenance interval has not yet passed, it prolongs the first maintenance interval based on a condition stored in the prolongation field 325, and stores this newly in the first maintenance interval storage 313 (step S4).

If maintenance is actually performed based on the notice, an actual maintenance interval on this occasion is stored in the maintenance frequency storage 318 (step S5). The first maintenance interval updater 319 takes out past maintenance intervals stored in the component maintenance frequency storage 318 after a proper period, and updates the first maintenance interval storage 313 with the shortest one out of the past maintenance intervals as a new first maintenance interval.

According to the configuration explained above, the parts maintenance management system capable of managing a maintenance timing of each component and giving notice thereof on the side of the unit composed of a plurality of components can be provided.

Namely, in a conventional apparatus, the management of expendable components is left to a user of the apparatus, and hence the expendable components need to be managed in the user's own management way. Moreover, in the replacement of expendable components based on simple exchange timings, the expendable components are sometimes replaced even when these expendable components are still sufficiently usable, which is undesirable from both environmental and economical viewpoints. Meanwhile, user's selfish judgement is dangerous since it leads to the breakdown of the entire apparatus.

On the other hand, in this unit, the first maintenance interval can be properly prolonged with reference to the second maintenance interval which is set based on the actual operation of the unit, and moreover this prolongation is performed based on a value previously set, whereby the aforesaid problem does not arise.

Next another embodiment of the present invention will be explained.

In the aforesaid embodiment, the example in which components in the coating unit (COT) are managed is explained. In this embodiment, the developing unit (DEV) in addition to the coating unit (COT) is mentioned. Namely, in the developing unit (DEV), similarly to the coating unit (COT), a developing solution is supplied onto the wafer W by a cup coater method. Accordingly, a motor for rotationally driving a spin chuck is provided. In this embodiment, especially, the maintenance demander 316 shown in FIG. 4 makes a maintenance demand with a demand for grease up in the coating unit (COT) simultaneously as a demand for grease up in the developing unit (DEV) (See step S3 in FIG. 5). Thereby, with respect to components in common, only a demand for one component needs to be performed, which can make control and maintenance (for example, data input) in the parts maintenance management system simpler.

Next, still another embodiment of the present invention will be explained.

Figure 8:
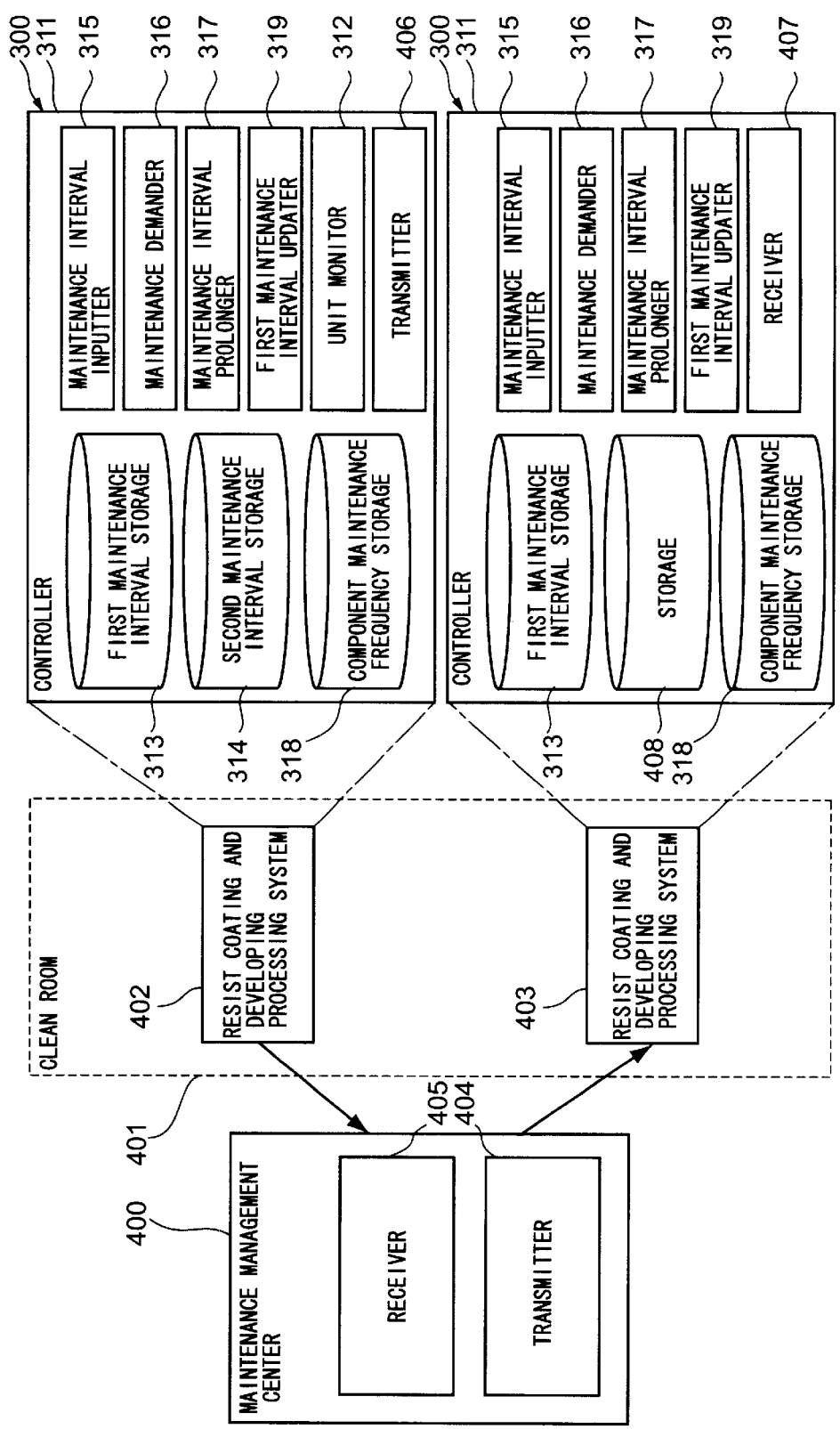
FIG. 8 is a diagram for explaining another embodiment of the present invention.

As shown in FIG. 8, a plurality of, for example, two resist coating and developing processing systems 402 and 403 shown in FIG. 1 to FIG. 3 are installed in a clean room 401. The numeral 400 denotes a maintenance management center having a transmitter 404 and a receiver 405 for uploading and downloading information between these resist coating and developing processing systems 402 and 403.

The resist coating and developing processing system 402 has a transmitter 406 for transmitting the information on the second maintenance interval stored in the second maintenance interval storage 314 to the maintenance management center 400 in addition to the configuration of the parts maintenance management system 300 shown in FIG. 4.

The resist coating and developing processing system 403 has a receiver 407 for receiving the information transmitted from the maintenance management center 400 and a storage 408 for storing the information in addition to the configuration of the parts maintenance management system 300 shown in FIG. 4, while it excludes the unit monitor 312 and the second maintenance interval storage 314. In the resist coating and developing processing system 403, the information stored in the storage 408 is used as the second interval. Hence, in this embodiment, the unit monitor in the resist coating and developing processing system 403 and a hardware configuration accompanying this become unnecessary. Incidentally, the information on the first maintenance interval may be added as information to be transmitted from the resist coating and developing processing system 402 to the resist coating and developing processing system 403. As a result, especially, control and maintenance (for example, data input) in the parts maintenance management system can be made simpler.

Next, yet another embodiment of the present invention will be explained.

Figure 9:
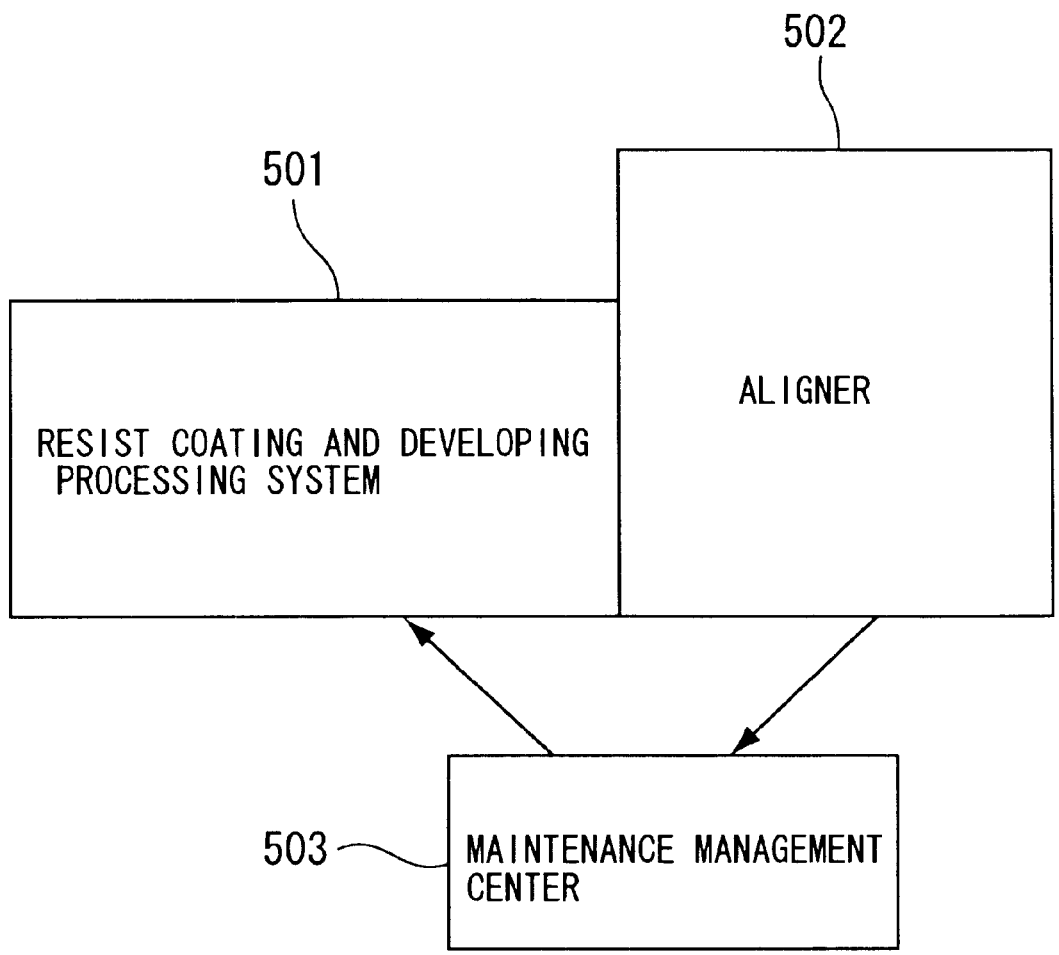
FIG. 9 is a diagram for explaining still another embodiment of the present invention.

In this embodiment, as shown in FIG. 9, a resist coating and developing processing system 501 and an aligner 502 connected thereto synchronize replacement of components. Namely, when receiving information that a component of the aligner 502 reaches an exchange timing, a maintenance management center 503 notifies the resist coating and developing processing system 501 of the information. The resist coating and developing processing system 501 replaces a component in synchronization with the aligner 502 based on the given information, which can shorten a stop time of the system for the replacement of components.

It should be mentioned that the present invention is not limited to the aforesaid embodiments, and may be modified variously without changing the spirit of the present invention.

For example, the aforesaid one embodiment is explained with the resist coating unit as an example of an apparatus having many components, but the present invention is not limited to this. Moreover, expendable components and their own maintenance conditions are not limited to the aforesaid ones, and can be modified variously.

As explained above, according to the present invention, the parts maintenance management system capable of managing a maintenance timing of each component and giving notice thereof on the side of an apparatus composed of a plurality of components.

The disclosure of Japanese Patent Application No.2000-142518 filed May 15, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A system for managing a maintenance timing of a component, comprising:
   a first maintenance interval storage for storing a first maintenance interval of the component which is not related to an actual utilization of a predetermined apparatus;
   a second maintenance interval storage storing a second maintenance interval of the component which is related to the actual utilization of the predetermined apparatus;
   a maintenance demander for demanding maintenance of the component based on passing of the first maintenance interval; and
   a maintenance interval prolonger for judging whether the second maintenance interval has passed or not based on the passing of the first maintenance interval, and when the second maintenance interval has not yet passed, suspending the demand for maintenance by the maintenance demander and prolonging the first maintenance interval.

2. The apparatus as set forth in claim 1,
   wherein the component is provided in the predetermined apparatus; and
   wherein the actual utilization of the predetermined apparatus which is related to the second maintenance interval is an actual operating time of the predetermined apparatus.

3. The system as set forth in claim 1,
   wherein the component is provided in the predetermined apparatus; and
   wherein the actual utilization of the predetermined apparatus which is related to the second maintenance interval is the number of times of operation of the predetermined apparatus.

4. The apparatus as set forth in claim 1,
   wherein the component is provided in the predetermined apparatus; and
   wherein the actual utilization of the predetermined apparatus which is related to the second maintenance interval is a movement distance of the predetermined apparatus.

5. The system as set forth in claim 1, further comprising:
   a maintenance frequency storage for storing an actual maintenance frequency of the component; and
   a first maintenance interval updater for taking out the maintenance frequency stored in the maintenance frequency storage after a lapse of a predetermined period and updating the first maintenance interval in the first maintenance interval storage with a shortest maintenance interval in the frequency as the first maintenance interval.

6. A system for managing maintenance timings of a first component and a second component in a processing system having a first apparatus having the first component and a second apparatus which has the second component identical to the first component and differs from the first apparatus, comprising:
   a first maintenance interval storage for storing a first maintenance interval of the first component which is not related to an actual utilization of the first apparatus;
   a second maintenance interval storage storing a second maintenance interval of the first component which is related to the actual utilization of the first apparatus;
   a maintenance demander for demanding maintenance of the first and second components based on passing of the first maintenance interval; and
   a maintenance interval prolonger for judging whether the second maintenance interval has passed or not based on the passing of the first maintenance interval, and when the second maintenance interval has not yet passed, suspending the demand for maintenance by the maintenance demander and prolonging the first maintenance interval.

7. The system as set forth in claim 6,
   wherein the first apparatus is a resist coating apparatus having a first rotating motor,
   wherein the second apparatus is a developing apparatus having a second rotating motor, and
   wherein the first and second components are greases to be supplied to the first and the second rotating motor.

8. A management system for managing maintenance timings of a first component and a second component in a first processing system having the first component and a second processing system which has the second component identical to the first component and is identical to the first processing system, comprising:
   a maintenance management center,
   wherein the first processing system comprises:
   a first maintenance interval storage for storing a first maintenance interval of the first component which is not related to an actual utilization of the first processing system;
   a second maintenance interval storage storing a second maintenance interval of the first component which is related to the actual utilization of the first processing system;
   a first maintenance demander for demanding maintenance of the first component based on passing of the first maintenance interval;
   a first maintenance interval prolonger for judging whether the second maintenance interval has passed or not based on the passing of the first maintenance interval, and when the second maintenance interval has not yet passed, suspending the demand for maintenance by the first maintenance demander and prolonging the first maintenance interval; and a first transmitter for transmitting at least information on the second maintenance interval stored in the second maintenance interval storage to the maintenance management center, wherein the maintenance management center comprises:

a first receiver for receiving the information transmitted from the first transmitter; and a second transmitter for transmitting the information received by the first receiver to the second processing system, and wherein the second processing system, comprises:

a second receiver for receiving the information transmitted from the second transmitter.

9. The system as set forth in claim 8, wherein the second processing system, further comprises:

a third maintenance interval storage for storing a third maintenance interval of the second component which is not related to an actual utilization of the second processing system;

a fourth maintenance interval storage storing the information received by the second receiver as a fourth maintenance interval of the second component which is related to the actual utilization of the second processing system;

a second maintenance demander for demanding maintenance of the second component based on passing of the third maintenance interval; and a second maintenance interval prolonger for judging whether the fourth maintenance interval has passed or not based on the passing of the third maintenance interval, and when the fourth maintenance interval has not yet passed, suspending the demand for maintenance by the second maintenance demander and prolonging the third maintenance interval.

10. The system as set forth in claim 8, wherein the first transmitter transmits information on the first maintenance interval stored in the first maintenance interval storage and the information on the second maintenance interval stored in the second maintenance interval storage to the maintenance management center.

11. The system as set forth in claim 8, wherein the first and the second processing system each are a resist coating and developing processing system for coating a substrate with a resist and developing the exposed substrate.

\* \* \* \* \*